(12) United States Patent
Liu et al.

(10) Patent No.: US 8,348,607 B2
(45) Date of Patent: Jan. 8, 2013

(54) HEAT DISSIPATING DEVICE AND BRACKET THEREOF

(75) Inventors: Lei Liu, Shenzhen (CN); Xiao-Feng Ma, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 673 days.

(21) Appl. No.: 12/412,389

(22) Filed: Mar. 27, 2009

(65) Prior Publication Data

US 2010/0218913 A1    Sep. 2, 2010

(30) Foreign Application Priority Data

Feb. 27, 2009    (CN) .......................... 2009 1 0300610

(51) Int. Cl.
*F01D 25/26*    (2006.01)

(52) U.S. Cl. ...................... 415/213.1; 361/695; 454/184

(58) Field of Classification Search ..................... 165/67, 165/68, 186, 104.34; 361/702, 707, 695; 415/213.1; 454/184; 312/223.2, 236
See application file for complete search history.

(56) References Cited

U.S. PATENT DOCUMENTS

| | | | | |
|---|---|---|---|---|
| 4,587,377 A * | 5/1986 | Rodseth | ........................ | 174/16.3 |
| 6,515,860 B1 * | 2/2003 | Shih | .............................. | 361/704 |
| 7,156,157 B2 * | 1/2007 | Liu | .............................. | 165/80.3 |
| 7,618,309 B2 * | 11/2009 | Liang | ........................... | 454/184 |
| 7,731,738 B2 * | 6/2010 | Jackson et al. | ................ | 606/304 |
| 7,874,348 B2 * | 1/2011 | Liu et al. | ........................ | 165/121 |
| 2008/0310118 A1 * | 12/2008 | Brocklesby et al. | ........... | 361/719 |

* cited by examiner

*Primary Examiner* — Alfred J Wujciak
(74) *Attorney, Agent, or Firm* — Altis Law Group, Inc.

(57) ABSTRACT

A heat dissipating device includes a heat dissipating element and a bracket. The bracket includes a first fixing portion and a second fixing portion. The first fixing portion is to fix the heating dissipating element. The second fixing portion is movably mounted to the first fixing portion. The second fixing portion is configured to fix the bracket to another apparatus to adjust a distance between the heat dissipating element and the apparatus.

5 Claims, 5 Drawing Sheets

HEAT DISSIPATING DEVICE AND BRACKET THEREOF

BACKGROUND

1. Technical Field

The present disclosure relates to heat dissipating devices, and particularly, to a heat dissipating device having a bracket.

2. Description of the Related Art

It is important to dissipate heat from an electronic device, such as a server chassis or a computer chassis. One way to dissipate heat from an electronic device is to fix a fan to a thermal sink of a central processing unit (CPU). Another way is to fix a fan to an inner wall of the computer chassis. However, the fan needs to be fixed at a specific position of the computer chassis causing limitations.

DETAILED DESCRIPTION

Figure 1:
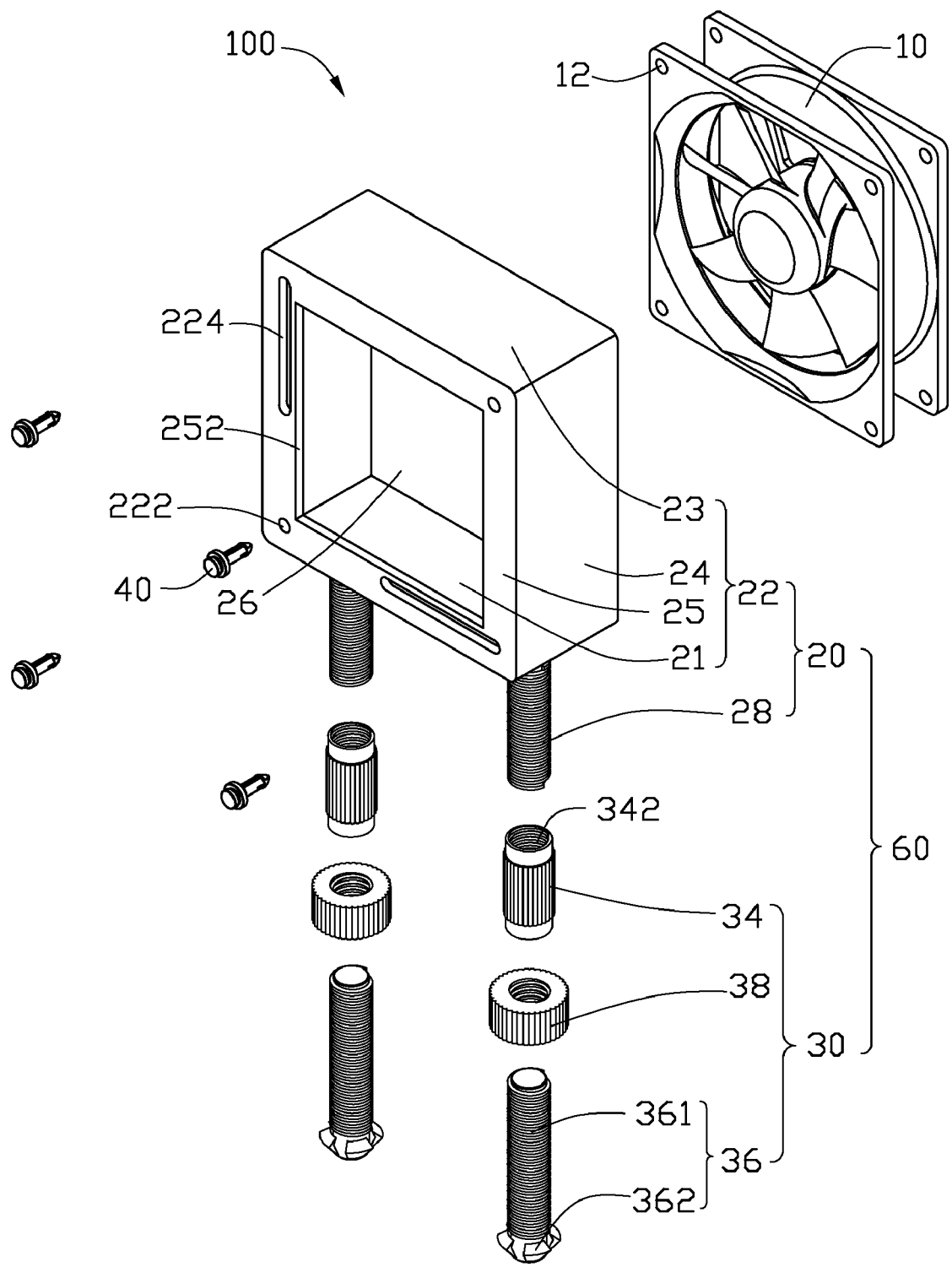
FIG. 1 is an exploded, isometric view of an exemplary embodiment of a heat dissipating device, the heat dissipating device including a latching member.

Referring to FIG. 1, an exemplary embodiment of a heat dissipating device 100 includes a heat dissipating element such as a fan 10 and a bracket 60. The bracket 60 includes a first fixing portion 20 and a second fixing portion 30. The fan 10 defines four fixing holes 12 in four corners of the fan 10.

The first fixing portion 20 includes a frame 22 and two screw pillars 28. The frame 22 includes a bottom wall 21, a top wall 23 parallel to the bottom wall 21, two sidewalls 24 connecting to corresponding ends of the bottom wall 21 and the top wall 23, and a flange 25 extending from corresponding sides of the bottom wall 21, the top wall 23, and the sidewalls 24 to form an annular part at a side of the first fixing portion 20. A receiving cavity 26 is bounded by the bottom wall 21, the top wall 23, the end walls 24, and the flange 25, and configured to receive the fan 10. An edge of the flange 25 bounds to define an opening 252, corresponding to the fan 10. Two through holes 222 are defined in two opposite corners of the flange 25. Two elongated locating grooves 224 are defined in the other two opposite corners of the flange 25 with one locating groove 224 being perpendicular to the bottom wall 21. The other locating groove 224 is parallel to the bottom wall 21. The screw pillars 28 are perpendicularly positioned under the bottom wall 21, to support the frame 22.

The second fixing portion 30 includes two spindle collars 34, two latching members 36, and two screw nuts 38.

Figure 2:
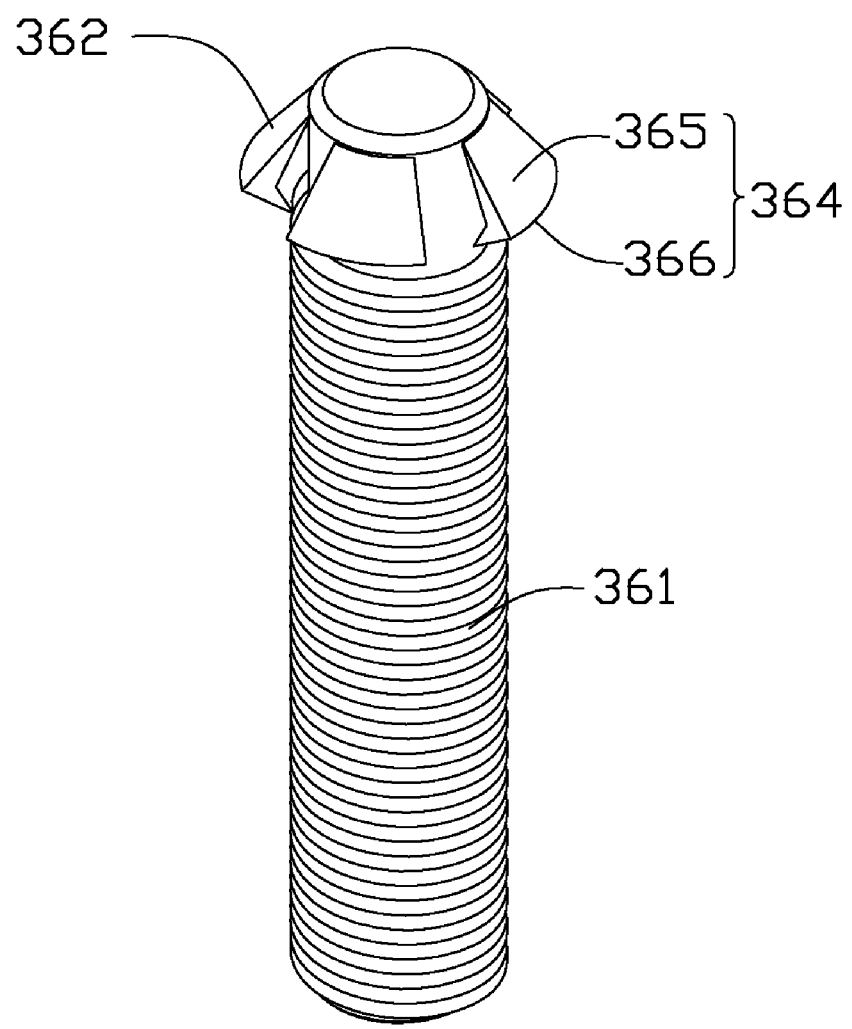
FIG. 2 is an inverted, enlarged view of the latching member of FIG. 1.

Referring to FIG. 2, each of the latching members 36 includes a screw pole 361 and a latching portion 362 positioned at a first end of the screw pole 361. The latching portion 362 includes a plurality of wedge-shaped elastic protrusions 364 distantly extending out from a circumference of the screw pole 361 towards a second end opposite to the first end of the screw pole 361. Each protrusion 364 includes two guiding surfaces 365, 366 at a top and a bottom of the protrusion 364, respectively. The spindle collar 34 axially defines a threaded hole 342, corresponding to the corresponding screw pillar 28 and the screw pole 361 of a corresponding latching member 36.

Figure 3:
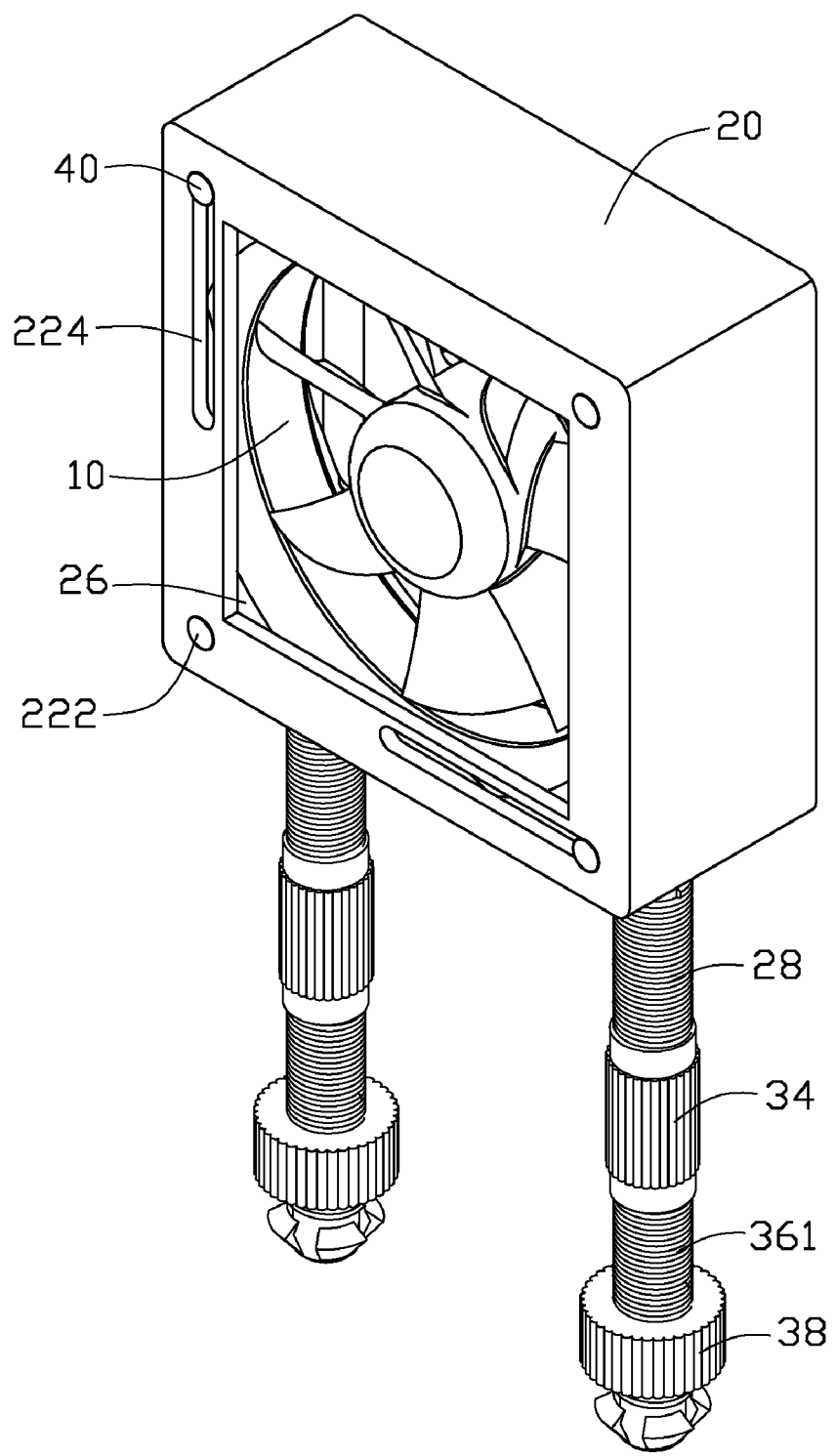
FIG. 3 is an assembled, isometric view of the heat dissipating device of FIG. 1.

Referring to FIG. 3, in assembly, the fan 10 is received in the receiving cavity 26 of the first fixing portion 20 and fixed in the first fixing portion 20 via four elastic pins 40 passing through the locating grooves 224 and the through holes 222 of the frame 22 to engage in the fixing holes 12 of the fan 10. The screw nuts 38 fit about the screw poles 361 of the latching members 36. The screw pillars 28 and the screw poles 361 of the latching members 36 are engaged in the corresponding spindle collars 34 from opposite ends of the spindle collars 34. In other embodiments, the fan 10 with other dimensions can be fixed in the first fixing member 20 via adjusting positions of the pins 40 in the locating grooves 224.

Figure 4:
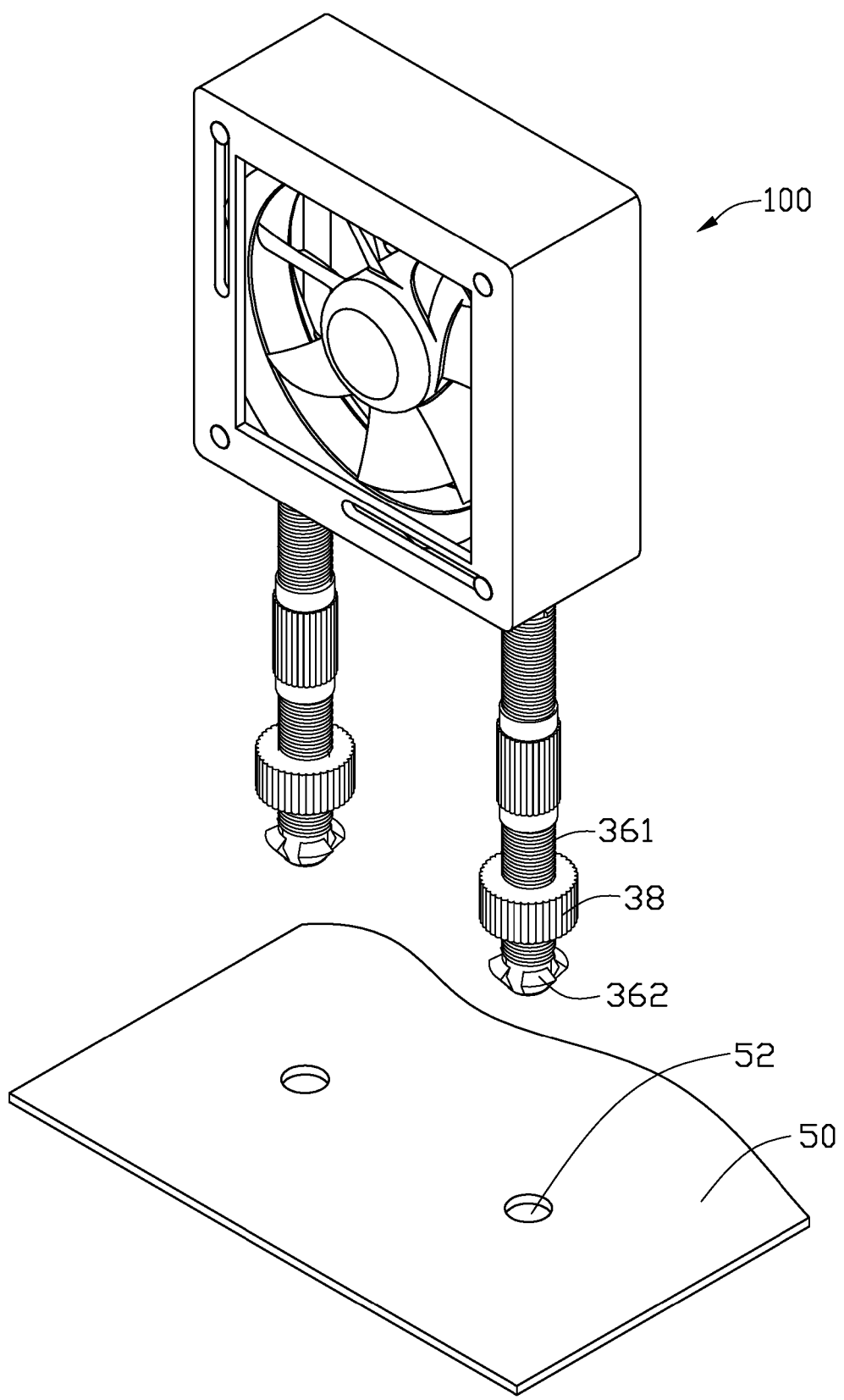
FIG. 4 is an exploded, isometric view of a board and the heat dissipating device of FIG. 3.
Figure 5:
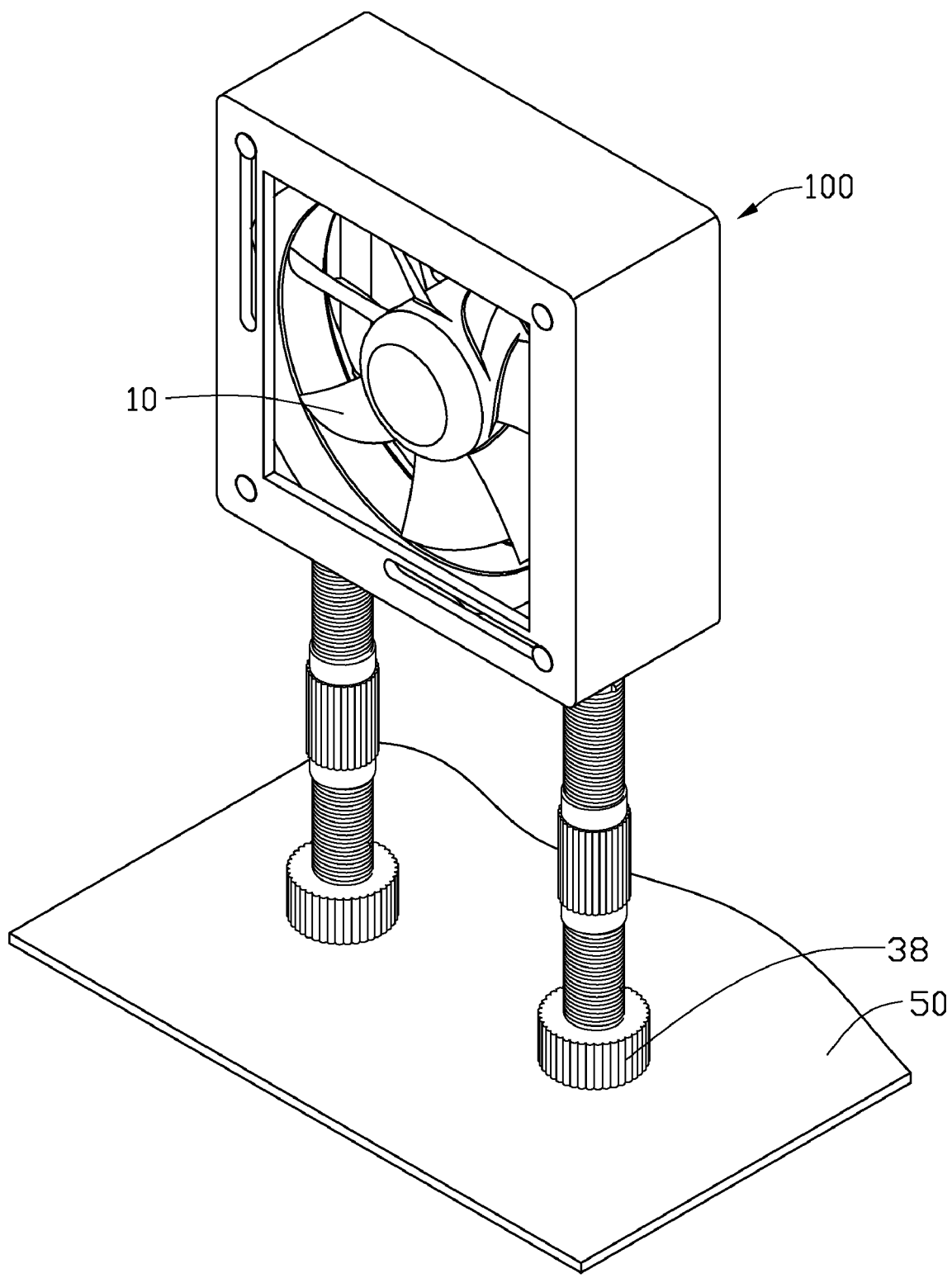
FIG. 5 is an assembled view of the board and the heat dissipating device of FIG. 4.

Referring to FIGS. 4 and 5, in use, the heat dissipating device 100 is mounted to a board 50, such as a motherboard of a computer, that defines two through holes 52 in the vicinity of a central processing unit (CPU) (not shown) set on the board 50. A diameter of each through hole 52 is smaller than a diameter of the latching portion 362 of the corresponding latching member 36. In other embodiments, the through holes 52 can be located on other positions of the board 50 according to need.

The latching portions 362 of the locating members 36 are inserted through the through holes 52 of the board 50 to deform the protrusions 364 via sidewalls bounding the through holes 52 resisting against the guiding surfaces 365 of the protrusions 364 of the latching members 36. The screw nuts 38 are adjusted to firmly resist against the board 50, therefore firmly engaging the board 50 together with the latching portions 362 of the latching member 36.

The heat dissipating device 100 can be disengaged from the through holes 52 of the board 50 via the sidewalls bounding the through holes 52 resisting against the guiding surfaces 366 of the protrusions 364 of the latching members 36 to deform the latching portions 362.

In one embodiment, a distance between the fan 10 and the board 50 can be adjusted via rotating the spindle collars 34. In other embodiments, the screw pillars 28 and the spindle collars 34 can be omitted, and two spindle collars 34 having threaded holes 342 are mounted to the bottom wall 21 of the frame 22 to engagably fit about the screw poles 361 of the latching members 36. A fixing block can directly extend from the screw pole 361 of each latching member, to replace the corresponding screw nut 38. Accordingly, a distance between the fixing block and the latching portion 362 is about equal to a thickness of the board 50.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A heat dissipating device, comprising:
   a heat dissipating element; and
   a bracket comprising a first fixing portion configured to fix the bracket to the heating dissipating element, and a second fixing portion configured to fix the bracket to an apparatus;
   wherein the second fixing portion is movably mounted to the first fixing portion to adjust a distance between the heat dissipating element and the apparatus, wherein the first fixing portion further comprises a frame supported on the second fixing portion, to receive the heat dissipating element, the frame comprises a bottom wall, a top wall parallel to the bottom wall, two sidewalls connected corresponding ends of the bottom wall and the top wall, and a flange extending from corresponding sides of the bottom wall, the top wall, and the sidewalls to form an annular part at a side of the frame, and wherein a receiving cavity is bounded by the bottom wall, the top wall, the sidewalls, and the flange, to receive the heat dissipating element, the second fixing portion comprises at least one latching member, the at least one latching member comprising a screw pole and a latching portion positioned at a first end of the screw pole configured to fix the second fixing portion to the apparatus, and wherein a second end opposite to the first end of the screw pole is movably mounted to the first fixing portion.

2. The heat dissipating device of claim 1, wherein the latching portion comprises a plurality of wedge-shaped elastic protrusions distantly extending out from a circumference of the screw pole towards the second end of the screw pole, each of the plurality of wedge-shaped elastic protrusions comprising two guiding surfaces at a top and a bottom thereof.

3. The heat dissipating device of claim 1, wherein the first fixing portion comprises at least one screw pillar being perpendicularly positioned under the bottom wall of the frame, the second fixing portion further comprises at least one spindle collar, the at least one spindle collar axially defining a threaded hole, and wherein a corresponding screw pillar and the screw pole of a corresponding latching member are movably engaged in opposite ends of the corresponding spindle collar via the threaded hole.

4. The heat dissipating device of claim 3, wherein the second fixing portion further comprises at least one screw nut, the at least one screw nut fitted about the screw pole of the corresponding latching member, the at least one screw nut configured to sandwich the apparatus together with the latching portion of the at least one latching member.

5. The heat dissipating device of claim 1, wherein the heat dissipating element is a fan, the flange defining two through holes in two opposite corners of the flange and two elongated locating grooves in the other two opposite corners of the flange, to fix the fan to the frame.

* * * * *